United States Patent
Xie et al.

(10) Patent No.: US 12,031,073 B2
(45) Date of Patent: Jul. 9, 2024

(54) NITRIDE NEAR-INFRARED FLUORESCENT MATERIAL AND PREPARATION METHOD AND APPLICATION THEREOF

(71) Applicant: Xiamen University, Fujian (CN)

(72) Inventors: Rongjun Xie, Fujian (CN); Shuxing Li, Fujian (CN)

(73) Assignee: XIAMEN UNIVERSITY, Xiamen (CN)

(*) Notice: Subject to any disclaimer, the term of this patent is extended or adjusted under 35 U.S.C. 154(b) by 457 days.

(21) Appl. No.: 17/614,211

(22) PCT Filed: Jun. 8, 2020

(86) PCT No.: PCT/CN2020/094849
§ 371 (c)(1),
(2) Date: Nov. 24, 2021

(87) PCT Pub. No.: WO2021/237799
PCT Pub. Date: Dec. 2, 2021

(65) Prior Publication Data
US 2022/0259498 A1 Aug. 18, 2022

(30) Foreign Application Priority Data
May 27, 2020 (CN) .......... 202010458499.6

(51) Int. Cl.
*C09K 11/77* (2006.01)
*C01B 21/06* (2006.01)
(Continued)

(52) U.S. Cl.
CPC .... *C09K 11/77348* (2021.01); *C01B 21/0602* (2013.01); *C09K 11/0883* (2013.01);
(Continued)

(58) Field of Classification Search
CPC ........ C09K 11/77348; C09K 11/77347; C01B 21/0602; C01B 11/0883; H01L 33/502;
(Continued)

(56) References Cited

FOREIGN PATENT DOCUMENTS

| CN | 102911662 A | 2/2013 |
|---|---|---|
| CN | 105814172 A | 7/2016 |

(Continued)

OTHER PUBLICATIONS

Wu et al., "Electronic structure and luminescence properties of self-activated and $Eu^{2+}/Ce^{3+}$ doped $Ca_3Li_{4-y}Si_2N_{6-y}O_y$ red-emitting phosphors," Journal of Luminescence 186 (2017) pp. 144-156, 9 pages.

*Primary Examiner* — Phuc T Dang
(74) *Attorney, Agent, or Firm* — MUNCY, GEISSLER, OLDS & LOWE, P.C.

(57) ABSTRACT

A nitride near-infrared fluorescent material has a general molecular formula of the nitride near-infrared fluorescent material is $(Ca_{1-x-y-z}Sr_xBa_yEu_z)_3[Li_aMg_bAl_cSi_d]N_6$. In the general molecular formula, $0 \leq x < 1$; $0 \leq y \leq 0.3$; $0 < z \leq 0.02$; $3.4 \leq a \leq 4$; $0 \leq b \leq 0.2$; $0 \leq c \leq 0.4$; $1.8 \leq d \leq 2$; $a+2b+3c+4d=12$. The material can be adjusted and controlled to achieve a maximum emission peak wavelength of 830 nm, a maximum half-peak width of 4283 $cm^{-1}$, and a quantum yield of 77%.

16 Claims, 8 Drawing Sheets

(51) Int. Cl.
*C09K 11/08* (2006.01)
*H01L 33/50* (2010.01)

(52) U.S. Cl.
CPC ...... *C09K 11/77347* (2021.01); *H01L 33/502* (2013.01); *C01P 2002/52* (2013.01); *C01P 2004/61* (2013.01); *C01P 2004/62* (2013.01)

(58) Field of Classification Search
CPC .............. C01P 2002/52; C01P 2004/61; C01P 2004/62
USPC .......................................................... 257/98
See application file for complete search history.

(56) References Cited

FOREIGN PATENT DOCUMENTS

| | | | | |
|---|---|---|---|---|
| CN | 106544027 A | * | 3/2017 | ......... C09K 11/7792 |
| CN | 107109215 A | | 8/2017 | |
| CN | 109742219 A | | 5/2019 | |
| CN | 111560247 A | | 8/2020 | |
| JP | 2019172714 A | | 10/2019 | |
| WO | WO-2014136961 A1 | * | 9/2014 | ............. C04B 35/58 |
| WO | WO-2020028889 A1 | * | 2/2020 | ........... A01G 9/1438 |

\* cited by examiner

NITRIDE NEAR-INFRARED FLUORESCENT MATERIAL AND PREPARATION METHOD AND APPLICATION THEREOF

CROSS REFERENCE TO RELATED APPLICATIONS

The present application is a U.S. national stage entry of PCT International Application PCT/CN2020/094849, filed Jun. 8, 2020 and claims priority to Chinese application no. CN 202010458499.6, which was filed on May 27, 202, the entire contents of which are hereby incorporated by reference.

TECHNICAL FIELD

The present invention relates to the technical field of the fluorescent material, and in particular, relates to a nitride near-infrared fluorescent material and a preparation method and application thereof.

BACKGROUND

Near-infrared (NIR) real-time non-destructive sensing technology enables advanced tip applications such as health monitoring, iris recognition, night vision lighting, driverless driving and the like to be realized. OSRAM uses blue diodes to excite near-infrared luminescent materials and has developed a miniaturized near-infrared spectrometer that can be used to identify food quality and monitor human health. Near-infrared sensor modules based on blue light chips and near-infrared luminescent materials can be easily integrated into portable devices such as mobile phones and tablets. Researchers at home and abroad are vying to develop and expect to obtain near-infrared luminescent materials that meet following properties: (i) the materials can be effectively excited by blue light; (ii) an emission spectrum covers a range of 600-1100 nm; (iii) the materials have high energy conversion efficiency; and (iv) the materials have strong near-infrared radiation power.

At present, most researches focus on the near-infrared emission of trivalent rare earth ions and transition metal ions (typically $Cr^{3+}$). However, f-f transition of trivalent rare earths is merely limited to narrow-band emission, while d-d transition of transition metals has a smaller absorption cross-section and lower transition probability due to the inherent spin forbiddenness. Meanwhile, a preparation process of $Cr^{3+}$-doped near-infrared materials inevitably produce highly toxic $Cr^{6+}$. Based on this, $Eu^{2+}$-doped near-infrared luminescent materials have received extensive attention and are expected to obtain high-efficient wide-spectrum emission. The $Eu^{2+}$-doped near-infrared luminescent materials that have been discovered at present are as follows:

(1) non-patent literature "Near infrared emission of $Eu^{2+}$ ions in $Ca_3Sc_2Si_3O_{12}$" (Berezovskaya, I. V., Dotsenko, V. P., Voloshinovskii, A. S., Smola, S. S., Chem. Phys. Lett. 585, 11-14(2013)) discloses that $Ca_3Sc_2Si_3O_{12}$:$Eu^{2+}$ exhibits wider emission light, but its excitation spectrum is in red and green light ranges and cannot be effectively excited by blue light;

(2) non-patent literature "Divalent europium-doped near-infrared-emitting phosphor for light-emitting diodes" (Qiao, J., Zhou, G., Zhou, Y., Zhang, Q., Xia, Z., Nature Commun., 10, 5267, (2019)) discloses that $K_3LuSi_2O_7$:$Eu^{2+}$ can emit near-infrared light with a peak wavelength of 740 nm under excitation of blue light, but its internal quantum yield is only 15%, which is far from practical applications;

(3) non-patent literatures "A $K_3ScSi_2O_7$:$Eu^{2+}$ based phosphor with broad-band NIR emission and robust thermal stability for NIR pc-LEDs" (Zhang, Q., Wang, X., Tang, Z., Wang, Y, Chem. Commun., DOI: 10.1039/d0cc01838d, (2020)) and "$Eu^{2+}$-doped ultra-broadband VIS-NIR emitting phosphor" (Tang, Z., Zhang, Q., Cao, Y., Li, Y., Wang, Y., Chem. Eng. J., 388, 124231 (2020)) respectively disclose that $K_3ScSi_2O_7$:$Eu^{2+}$ and $Ba_3ScB_3O_9$:$Eu^2$ can emit near-infrared light with a peak wavelength of 735 nm under excitation of blue light, but both have the problem of low internal quantum yield; and (4) non-patent literature "Electronic structure and luminescence properties of self-activated and $Eu^{2+}/Ce^{3+}$ doped $Ca_3Li_{4-y}Si_2N_{6-y}O_y$ red-emitting phosphors. J. Lumin" (Wu, Q., Ding, J., Li, Y., Wang, X., Wang, Y., 186, 144-151(2017)) discloses that optical properties of $Ca_3Li_{4-y}Si_2N_{6-y}O_y$:$Eu^{2+}/Ce^{3+}$ infrared fluorescent material have been reported, but its peak wavelength is at 700 nm and the quantum yield is low, and it is difficult to meet the application requirements of near-infrared fluorescent materials.

SUMMARY

A purpose of the present invention is to overcome a problem of low quantum yield of existing near-infrared fluorescent materials, and to provide a nitride near-infrared fluorescent material with a same crystal structure as $Ca_3[Li_4Si_2]N_6$, wherein a general molecular formula of nitride matrix is $(Ca_{1-x-y-z}Sr_xBa_yEu_z)_3[Li_aMg_bAl_cSi_d]N_6$ ($0 \leq x < 1$; $0 \leq y \leq 0.3$; $0 < z \leq 0.02$; $3.4 \leq a \leq 4$; $0 \leq b \leq 0.2$; $0 \leq c \leq 0.4$; $1.8 \leq d \leq 2$; $a+2b+3c+4d=12$), and a near-infrared luminescent material with a quantum yield of up to 77% can be obtained by doping 0.1%-2% of Eu in the matrix to enter Ca or Sr or Ba site.

The present invention further provides a preparation method of the nitride near-infrared fluorescent material, including mixing and sintering. The preparation method has low synthesis temperature, convenient operation and high safety.

The present invention further relates to application of the nitride near-infrared fluorescent material in the fields of security and detection, which can achieve a maximum emission peak wavelength (maximum 830 nm), a maximum half-peak width (maximum 4283 cm-1) and a maximum quantum yield (77%) by adjusting and controlling the preparation method and has relatively good application potential.

Finally, the present invention further seeks protection for a light-emitting device, which includes a fluorescent material and an excitation light source, the fluorescent material is the nitride near-infrared fluorescent material, and the excitation light source has a wavelength of 250-700 nm, includes ultraviolet light or light sources of blue light and blue-green light, and preferably an LED light source.

A specific solution is described as follows. A nitride near-infrared fluorescent material, a general molecular formula of the nitride near-infrared fluorescent material is $(Ca_{1-x-y-z}Sr_xBa_yEu_z)_3[Li_aMg_bAl_cSi_d]N_6$, Eu element enters a crystal site of at least one of Ca, Sr, and Ba, as a luminous element and activator. In the general molecular formula, $0 \leq x < 1$; $0 \leq y \leq 0.3$; $0 < z \leq 0.02$; $3.4 \leq a \leq 4$; $0 \leq b \leq 0.2$; $0 \leq c \leq 0.4$; $1.8 \leq d \leq 2$; $a+2b+3c+4d=12$.

Further, in the general molecular formula $(Ca_{1-x-y-z}Sr_xBa_yEu_z)_3[Li_aMg_bAl_cSi_d]N_6$, $0.4 \leq x < 1$; $0 \leq y \leq 0.3$; $0 < z \leq 0.02$. Optionally, in the general molecular formula $(Ca_{1-x-y-z}Sr_xBa_yEu_z)_3[Li_aMg_bAl_cSi_d]N_6$, $3.4 \leq a \leq 4$; $0 \leq b \leq 0.2$; $0 \leq c \leq 0.4$; $1.8 \leq d \leq 2$.

Further, in the general molecular formula, $x=0.699$, $y=0.3$, $z=0.001$, and $a=4$, $b=0$, $c=0$, $d=2$, and in this case, a peak wavelength of an emission spectrum is longest, i.e., 830 nm.

Further, in the general molecular formula, $x=0.5$, $y=0$, $z=0.001$, and $a=4$, $b=0$, $c=0$, $d=2$, and in this case, a half-peak width of the emission spectrum is maximum, and is 4283 cm$^{-1}$.

Further, in the general molecular formula, $x=0.999$, $y=0$, $z=0.001$, and $3.4 \leq a < 4$; $0 \leq b \leq 0.2$; $0 \leq c \leq 0.4$; $1.8 \leq d < 2$, and the half-peak widths of the emission spectrum are all greater than 3500 cm$^{-1}$. Optionally, in the general molecular formula, $x=0.999$, $y=0$, $z=0.001$, and $a=4$, $b=0$, $c=0$, $d=2$, and in this case, quantum efficiency of the emission spectrum is maximum, and is 77%.

Further, the nitride near-infrared fluorescent material emits fluorescence with a peak in the wavelength range of 600 to 1100 nm under excitation of ultraviolet light with a wavelength of 250 to 700 nm.

Optionally, crystals of the nitride near-infrared fluorescent material are generated in a manner of a mixture containing other crystalline or non-crystalline compounds, and a mass content of the crystals of the nitride near-infrared fluorescent material in the mixture is not less than 40%.

Optionally, the nitride near-infrared fluorescent material includes compounds represented by one or more of following chemical formulas: $(Sr_{0.999}Eu_{0.001})_3[Li_4Si_2]N_6$, $(Ca_{0.5}Sr_{0.499}Eu_{0.001})_3[Li_4Si_2]N_6$, $(Sr_{0.699}Ba_{0.3}Eu_{0.001})_3[Li_4Si_2]N_6$, $(Sr_{0.999}Eu_{0.001})_3[Li_{3.9}Al_{0.3}Si_{1.8}]N_6$, $(Sr_{0.999}Eu_{0.001})_3[Li_{3.9}Mg_{0.1}Al_{0.1}Si_{1.9}]N_6$, $(Sr_{0.999}Eu_{0.001})_3[Li_{3.6}Al_{0.4}Si_{1.8}]N_6$, $(Sr_{0.999}Eu_{0.001})_3[Li_{3.7}Mg_{0.1}Al_{0.3}Si_{1.8}]N_6$, $(Sr_{0.999}Eu_{0.001})_3[Li_{3.7}Mg_{0.2}Al_{0.1}Si_{1.9}]N_6$.

The present invention further seeks protection for a preparation method of the nitride near-infrared fluorescent material, which includes following steps: step (1): weighing $Ca_3N_2$ powder, $Sr_3N_2$ powder, $Ba_3N_2$ powder, $Li_3N$ powder, $Mg_3N_2$ powder, AlN powder, $Si_3N_4$ powder, and EuN and/or $Eu_2O_3$ and/or $EuF_3$ and/or $EuCl_2$ powder, respectively according to stoichiometric ratio of the general molecular formula as starting materials, fully mixing the materials uniformly in a glove box filled with nitrogen atmosphere to prepare a raw material mixture; and step (2): keeping and sintering the obtained raw material mixture at a temperature range of 800-1000° C. for 2-6 hours in a nitrogen-hydrogen mixed atmosphere or a nitrogen-hydrogen-ammonia mixed atmosphere to obtain the nitride near-infrared fluorescent material.

Further, in the step (1), a particle size of the powder is at micron, sub-micron or nanometer level. Optionally, in the step (2), the mixed atmosphere is normal pressure or micro-positive pressure, and a pressure value of the micro-positive pressure is 0-1 MPa. Optionally, in the step (2), the raw material mixture is kept and sintered at a temperature range of 850-950° C. for 2-6 hours. Optionally, the step (2) includes step (2a) in which the obtained raw material mixture is kept and sintered at a temperature range of 800-1000° C. for 2-6 hours in a nitrogen-hydrogen mixed atmosphere or a nitrogen-hydrogen-ammonia mixed atmosphere, and step (2b) in which the sintered product is subjected to heat treatment at a temperature greater than 500° C. and less than 800-1000° C. for 1-10 hours in a hydrogen atmosphere to obtain the nitride near-infrared fluorescent material.

The present invention further relates to application of the nitride near-infrared fluorescent material in the field of security or monitoring, and in particular, the nitride near-infrared fluorescent material is excited by a light source having a wavelength of 250-700 nm, and an emission wavelength is 600-1100 nm.

The present invention further seeks protection for a light-emitting device, which includes a fluorescent material and an excitation light source, the fluorescent material is the nitride near-infrared fluorescent material, and a wavelength of the excitation light source is 250-700 nm.

The invention provides the following advantageous effects. A crystal structure of the nitride near-infrared fluorescent material of the present invention is the same as $Ca_3[Li_4Si_2]N_6$, wherein a general molecular formula is $(Ca_{1-x-y-z}Sr_xBa_yEu_z)_3[Li_aMg_bAl_cSi_d]N_6$ ($0 \leq x < 1$; $0 \leq y \leq 0.3$; $0 < z \leq 0.02$; $3.4 \leq a \leq 4$; $0 \leq b \leq 0.2$; $0 \leq c \leq 0.4$; $1.8 \leq d \leq 2$; $a+2b+3c+4d=12$), a series of matrix materials that emit near-infrared light can be produced by adjusting chemical composition of the matrix, the emission spectrum, quantum yield, and half-peak width of the near-infrared luminescent material can be adjusted and controlled by optimizing the composition to obtain a nitride near-infrared luminescent material that can be effectively excited by blue light, and has a relatively long wavelength at emission peak ($\geq 800$ nm), a relatively wide half-peak width ($\geq 3500$ cm$^{-1}$), and a high quantum yield.

A solid-phase sintering preparation method of the $Eu^{2+}$ activated nitride matrix near-infrared fluorescent material provided by the present invention has low synthesis temperature, simple operation and easy mass production.

BRIEF DESCRIPTION OF DRAWINGS

In order to explain the technical solution of the present invention more clearly, the figures will be introduced briefly below. Obviously, the following described figures merely relate to some of the embodiments of the present invention, but do not limit the present invention.

DETAILED DESCRIPTION OF THE EMBODIMENTS

Figure 1:
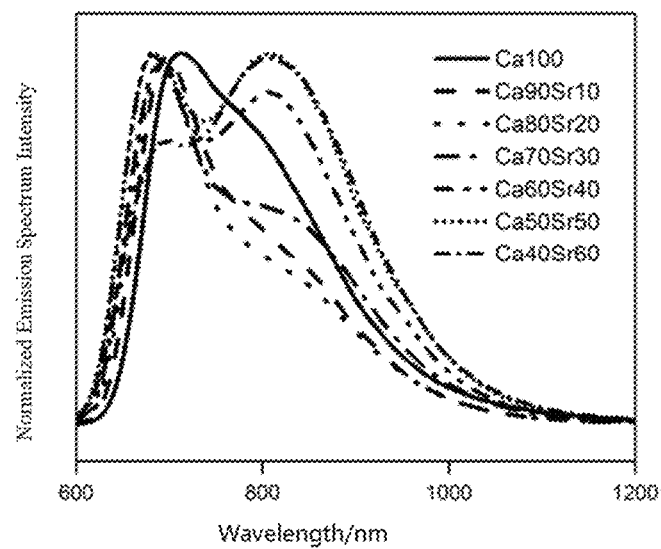
FIG. 1 is an emission spectrum diagram of Embodiments 1-7 of the present invention, of which chemical compositions are $(Ca_{0.999}Eu_{0.001})_3[Li_4Si_2]N_6$ (abbreviated as Ca100), $(Ca_{0.899}Sr_{0.1}Eu_{0.001})_3[Li_4Si_2]N_6$ (abbreviated as Ca90Sr10), $(Ca_{0.799}Sr_{0.2}Eu_{0.001})_3[Li_4Si_2]N_6$ (abbreviated as Ca80Sr20), $(Ca_{0.699}Sr_{0.3}Eu_{0.001})_3[Li_4Si_2]N_6$ (abbreviated as Ca70Sr30), $(Ca_{0.599}Sr_{0.4}Eu_{0.001})_3[Li_4Si_2]N_6$ (abbreviated as Ca60Sr40), $(Ca_{0.499}Sr_{0.5}Eu_{0.001})_3[Li_4Si_2]N_6$ (abbreviated as Ca50Sr50), $(Ca_{0.399}Sr_{0.6}Eu_{0.001})_3[Li_4Si_2]N_6$ (abbreviated as Ca40Sr60), respectively, under excitation of blue light.

Definitions of some terms used in the present invention are provided below, and other unmentioned terms have definitions and meanings well known in the art. A near-infrared fluorescent material: a material having a fluorescence emission spectrum in a near-infrared band range of 700-1100 nm. In the present invention, the near-infrared fluorescent material is the nitride, of which a crystal structure is the same as that of $a_3[Li_4Si_2]N_6$, and a general molecular formula is: $(Ca_{1-x-y-z}Sr_xBa_yEu_z)_3[Li_aMg_bAl_cSi_d]N_6$ ($0 \leq x < 1$; $0 \leq y \leq 0.3$; $0 < z \leq 0.02$; $3.4 \leq a \leq 4$; $0 \leq b \leq 0.2$; $0 \leq c \leq 0.4$; $1.8 \leq d \leq 2$; $a+2b+3c+4d=12$). Eu element enters a crystal site of at least one of Ca, Sr and Ba as a light emitting element and activator, thereby having fluorescence characteristics. When $y>0.3$ and/or $b>0.2$ and/or $c>0.4$, an impurity phase will appear in a crystalline phase, resulting in decrease in luminous efficiency.

Preferably, in the general molecular formula, $0 \leq x < 1$; $0 \leq y \leq 0.3$; $0 < z \leq 0.02$; more preferably, in the general molecular formula, $0.5 \leq x < 1$; $0 \leq y \leq 0.3$; $0 < z \leq 0.005$. Sr element and/or Ba element are/or introduced to reduce a content of Ca element, which can achieve a significant effect of red-shifting a peak wavelength of an emission spectrum from 700 nm to 830 nm.

Preferably, in the general molecular formula, $3.4 \leq a \leq 4$; $0 \leq b \leq 0.2$; $0 \leq c \leq 0.4$; $1.8 \leq d \leq 2$. By introducing Mg element and/or Al element, a half-peak width of the emission spectrum of the material is significantly increased from 3108 to 4101 cm$^{-1}$.

The nitride near-infrared fluorescent material of the present invention has the same crystal structure as the crystal structure of $Ca_3[Li_4Si_2]N_6$, but it reflects performances prior to the $Ca_3[Li_4Si_2]N_6$ material due to the changes in the elements in corresponding lattice positions in the crystal structure. Specifically, the peak wavelength of the emission spectrum has achieved significant red-shift from 700 nm to 830 nm; the half-peak width of the emission spectrum has achieved significant increase from 3195 cm$^{-1}$ to 4283 cm$^{-1}$; the quantum yield of the emission spectrum has been significantly improved from <20% to 77%.

In a preparation method of the nitride near-infrared fluorescent material of the present invention, raw materials adopt nitrides of respective elements, for example: $Ca_3N_2$ powder, $Sr_3N_2$ powder, $Ba_3N_2$ powder, $Li_3N$ powder, $Mg_3N_2$ powder, AlN powder, $Si_3N_4$ powder, and it needs to explain that Eu source can adopt its nitride EuN, and can also adopt $Eu_2O_3$, $EuF_3$ or $EuCl_2$ powder and the like. A temperature for sintering and holding after mixing the raw materials is 800 to 1000° C., preferably 850 to 950° C., more preferably 865 to 935° C., such as 875° C., 880° C., 890° C., 900° C., or 915° C. The product obtained by sintering can be further heat-treated at a temperature greater than 500° C. and less than 800-1000° C. in a hydrogen atmosphere for 1-10 hours to increase the relative content of Eu$^2$ in the material.

Further, the product obtained by sintering can also be subjected to at least one method of pulverization, surface coating, and classification treatment to perform particle size adjustment and surface modification on the obtained fluorescent material. These methods can all be the same as the prior art, which can be well known by those skilled in the art, and will not be repeated here.

The preferred embodiments of the present invention will be described in more detail below. Although the preferred embodiments of the present invention are described below, it should be understood that the present invention can be implemented in various forms and should not be limited by the embodiments illustrated herein. The embodiments in which specific techniques or conditions are not noted, are performed according to the techniques or conditions described in the documents within the prior art or according to the product specifications. The used reagents or instruments that are not marked with manufacturers are all conventional products that can be obtained through market shopping. In the following embodiments, if not explicitly explained, "%" refers to weight percentage.

Embodiments 1-14

Embodiments 1-14 of the present invention provide fourteen nitride near-infrared fluorescent materials activated by Eu²⁺, of which chemical formulas are respectively: $(Ca_{0.899}Sr_{0.1}Eu_{0.001})_3[Li_4Si_2]N_6$ (abbreviated as Ca90Sr10), $(Ca_{0.799}Sr_{0.2}Eu_{0.001})_3[Li_4Si_2]N_6$ (abbreviated as Ca80Sr20), $(Ca_{0.699}Sr_{0.3}Eu_{0.001})_3[Li_4Si_2]N_6$ (abbreviated as Ca70Sr30), $(Ca_{0.599}Sr_{0.4}Eu_{0.001})_3[Li_4Si_2]N_6$ (abbreviated as Ca60Sr40), $(Ca_{0.499}Sr_{0.5}Eu_{0.001})_3[Li_4Si_2]N_6$ (abbreviated as Ca50Sr50), $(Ca_{0.399}Sr_{0.6}Eu_{0.001})_3[Li_4Si_2]N_6$ (abbreviated as Ca40Sr60), $(Ca_{0.299}Sr_{0.7}Eu_{0.001})_3[Li_4Si_2]N_6$ (abbreviated as Ca30Sr70), $(Ca_{0.199}Sr_{0.8}Eu_{0.001})_3[Li_4Si_2]N_6$ (abbreviated as Ca20Sr80), $(Ca_{0.099}Sr_{0.9}Eu_{0.001})_3[Li_4Si_2]N_6$ (abbreviated as Ca10Sr90), $(Sr_{0.999}Eu_{0.001})_3[Li_4Si_2]N_6$ (abbreviated as Sr100), $(Sr_{0.899}Ba_{0.1}Eu_{0.001})_3[Li_4Si_2]N_6$ (abbreviated as Sr90Ba10), $(Sr_{0.799}Ba_{0.2}Eu_{0.001})_3[Li_4Si_2]N_6$ (abbreviated as Sr80Ba20), $(Sr_{0.699}Ba_{0.3}Eu_{0.001})_3[Li_4Si_2]N_6$ (abbreviated as Sr70Ba30).

Embodiments 1-14 of the present invention provide a preparation method of the nitride near-infrared fluorescent materials activated by Eu²⁺, including weighing $Ca_3N_2$ powder, $Sr_3N_2$ powder, $Ba_3N_2$ powder, $Li_3N$ powder, $Si_3N_4$ powder, and EuN powder according to stoichiometric ratio as starting materials, keeping and sintering the materials at 900° C. for 6 hours in a nitrogen-hydrogen mixed atmosphere, and furnace cooling, and taking a sample from the furnace for grinding, pulverization and subsequent related tests.

Figure 2:
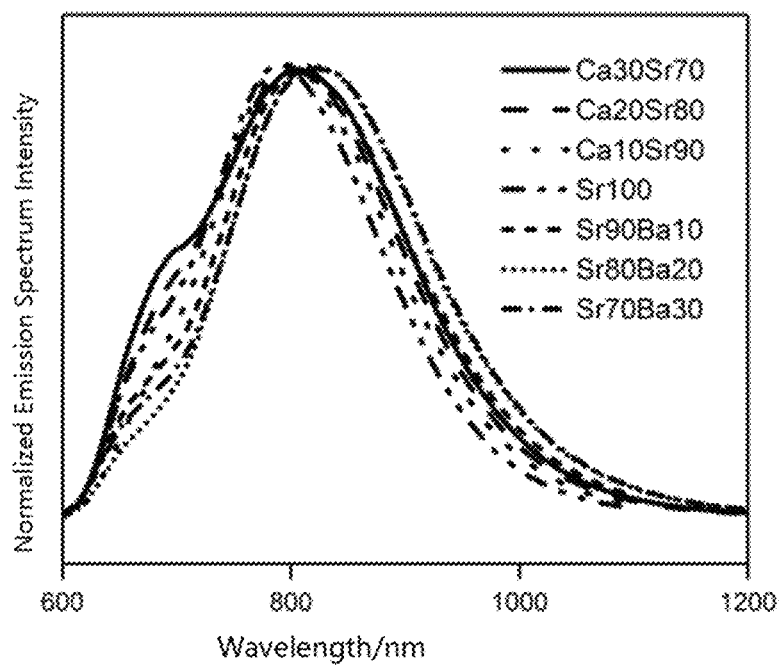
FIG. 2 is an emission spectrum diagram of Embodiments 8-14 of the present invention, of which chemical compositions are $(Ca_{0.299}Sr_{0.7}Eu_{0.001})_3[Li_4Si_2]N_6$ (abbreviated as Ca30Sr70), $(Ca_{0.199}Sr_{0.8}Eu_{0.001})_3[Li_4Si_2]N_6$ (abbreviated as Ca20Sr80), $(Ca_{0.099}Sr_{0.9}Eu_{0.001})_3[Li_4Si_2]N_6$ (abbreviated as Ca10Sr90), $(Sr_{0.999}Eu_{0.001})_3[Li_4Si_2]N_6$ (abbreviated as Sr100), $(Sr_{0.899}Ba_{0.1}Eu_{0.001})_3[Li_4Si_2]N_6$ (abbreviated as Sr90Ba10), $(Sr_{0.799}Ba_{0.2}Eu_{0.001})_3[Li_4Si_2]N_6$ (abbreviated as Sr80Ba20), $(Sr_{0.699}Ba_{0.3}Eu_{0.001})_3[Li_4Si_2]N_6$ (abbreviated as Sr80Ba20), respectively, under excitation of blue light.

FIGS. 1 and 2 illustrate emission spectra of materials of Embodiments 1-14 of the present invention under excitation of blue light. For Embodiments 1-11, the emission spectrum exhibits double-peak emission, the peak position of the short wavelength is at 700 nm, and the peak position of the long wavelength is located at 800 nm. As the content of Ca in the chemical composition decreases, and the content of Sr increases, the emission intensity of the peak position at 700 nm gradually decreases, and at the same time, the emission intensity of the peak position located at 800 nm gradually increases. The dominant wavelength of the emission spectrum of Embodiment 1 is at 700 nm, and the peak wavelength of the emission spectrum of Embodiment 11 is at 800 nm. As the content of Ca in the chemical composition decreases, and the content of Sr increases, the main peak wavelength gradually red shifts. For Embodiments 11-14, as the content of Sr in the chemical composition decreases, and the content of Ba increases, the main peak wavelength gradually redshifts from 800 nm to 830 nm.

Figure 3:
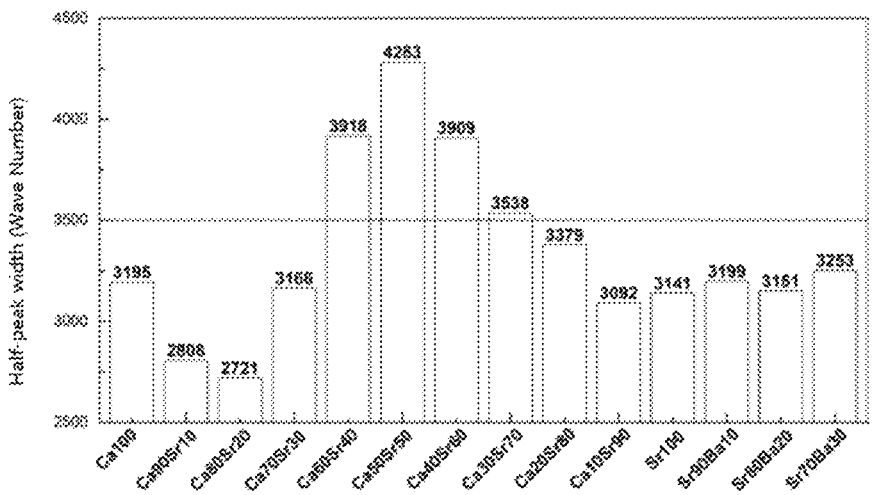
FIG. 3 is a half-peak width comparison diagram of the emission spectrum of materials of Embodiments 1-14 of the present invention under excitation of blue light.

FIG. 3 illustrates a half-peak width of the emission spectrum of Embodiments 1-14 of the present invention. Since the relative intensities of double-peak emissions at 700 nm and 800 nm gradually change, the half-peak width of the emission spectrum exhibits a parabolic change rule. The half-peak width of Embodiment 6 is maximum, which is 4283 cm-1.

Figure 4:
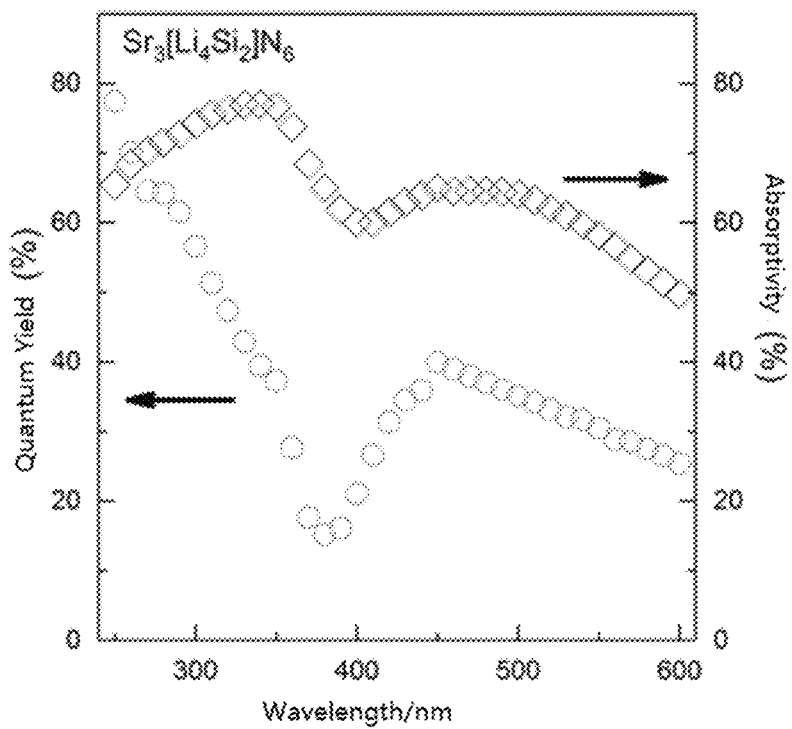
FIG. 4 is a diagram of quantum yield and absorption rate of Embodiment 11 of the present invention, of which a chemical composition is $(Sr_{0.999}Eu_{0.001})_3[Li_4Si_2]N_6$, excited under different excitation wavelengths.

FIG. 4 illustrates a diagram of change rule of the quantum yield and absorption rate with the excitation wavelength of Embodiment 11 of the present invention. It is not difficult to find out that the near-infrared fluorescent material has excellent absorption rate under both ultraviolet and blue excitation; Under the excitation of 250 nm ultraviolet light, the quantum yield of the near-infrared fluorescent material is up to 77%, and under the excitation of 450 nm blue light, the quantum yield is up to 40%.

Figure 5:
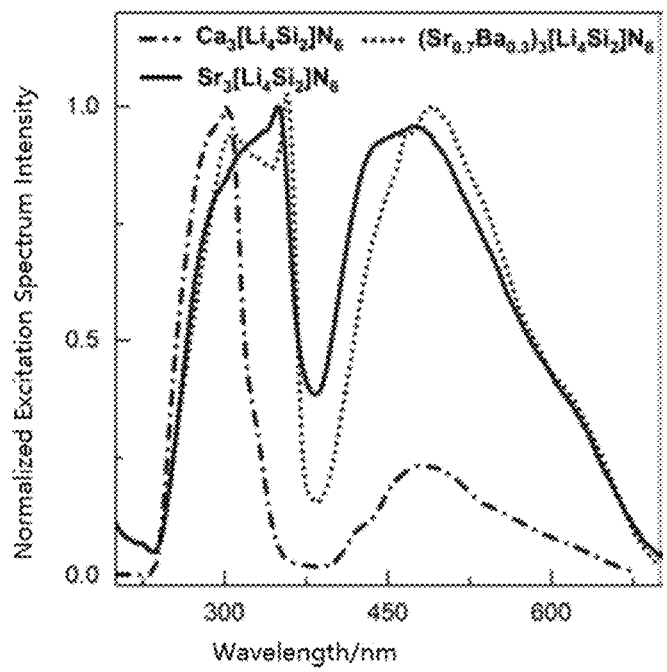
FIG. 5 is an excitation spectrum diagram of Embodiments 1, 11 and 14, of which chemical compositions are $(Ca_{0.999}Eu_{0.001})_3[Li_4Si_2]N_6$, $(Sr_{0.999}Eu_{0.001})_3[Li_4Si_2]N_6$ and $(Sr_{0.699}Ba_{0.3}Eu_{0.001})_3[Li_4Si_2]N_6$, respectively.
Figure 6:
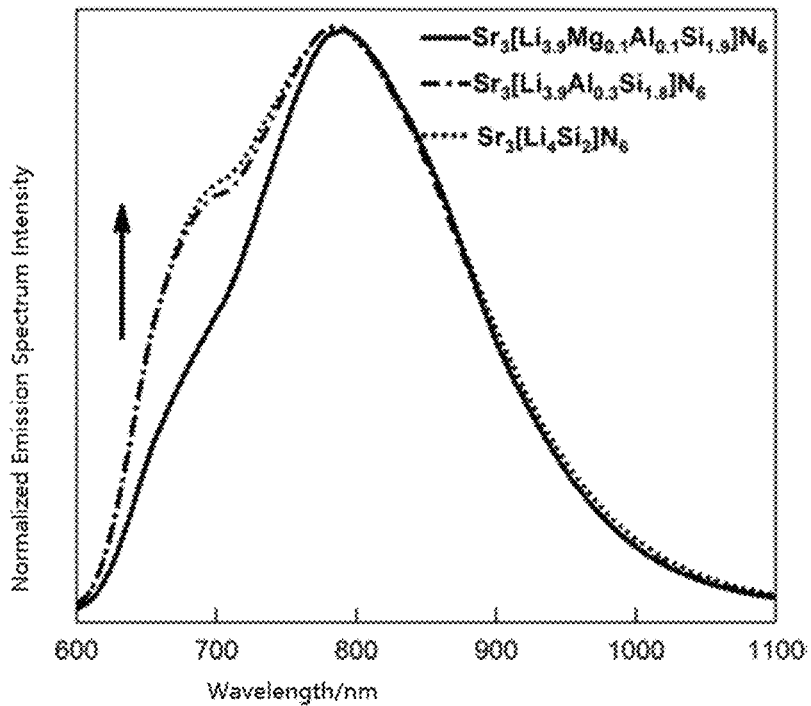
FIG. 6 is an emission spectrum diagram of Embodiments 11 and 15-16 of the present invention, of which chemical compositions are $(Sr_{0.999}Eu_{0.001})_3[Li_4Si_2]N_6$, $(Sr_{0.999}Eu_{0.001})_3[Li_{3.9}Al_{0.3}Si_{1.8}]N_6$ and $(Sr_{0.999}Eu_{0.001})_3[Li_{3.9}Mg_{0.1}Al_{0.1}Si_{1.9}]N_6$, respectively, under excitation of blue light.
Figure 7:
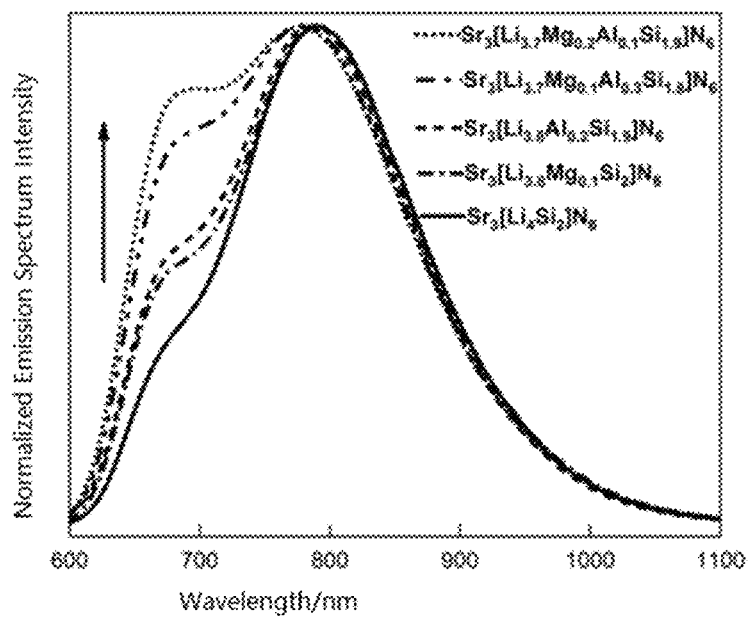
FIG. 7 is an emission spectrum diagram of Embodiments 11 and 17-20 of the present invention, of which chemical compositions are $(Sr_{0.999}Eu_{0.001})_3[Li_4Si_2]N_6$, $(Sr_{0.999}Eu_{0.001})_3[Li_{3.8}Mg_{0.1}Si_2]N_6$, $(Sr_{0.999}Eu_{0.001})_3[Li_{3.8}Al_{0.2}Si_{1.9}]N_6$, $(Sr_{0.999}Eu_{0.001})_3[Li_{3.7}Mg_{0.1}Al_{0.3}Si_{1.8}]N_6$ and $(Sr_{0.999}Eu_{0.001})_3[Li_{3.7}Mg_{0.2}Al_{0.1}Si_{1.9}]N_6$, respectively, under excitation of blue light.
Figure 8:
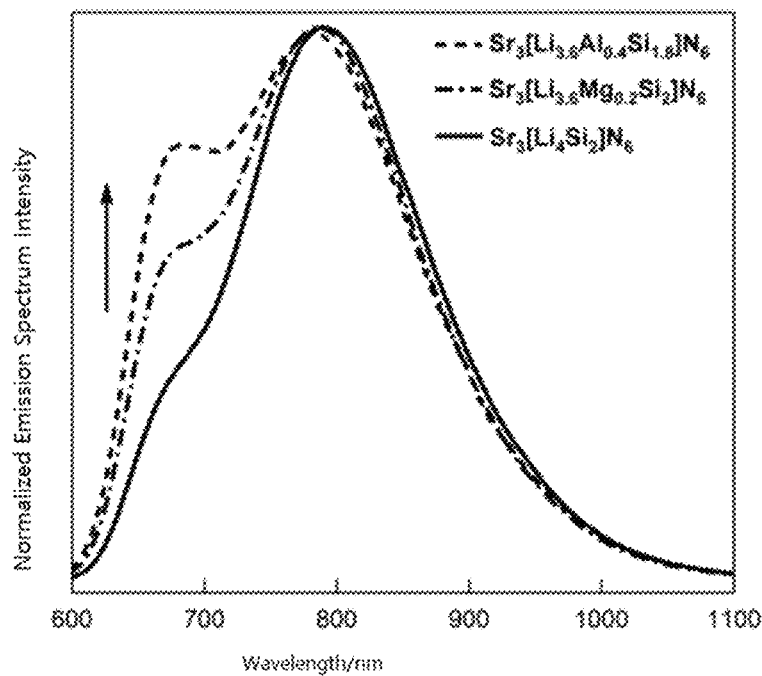
FIG. 8 is an emission spectrum diagram of Embodiments 11 and 21-22 of the present invention, of which chemical compositions are $(Sr_{0.999}Eu_{0.001})_3[Li_4Si_2]N_6$, $(Sr_{0.999}Eu_{0.001})_3[Li_{3.6}Mg_{0.2}Si_2]N_6$ and $(Sr_{0.999}Eu_{0.001})_3[Li_{3.6}Mg_{0.4}Si_{1.8}]N_6$, respectively, under excitation of blue light.
Figure 9:
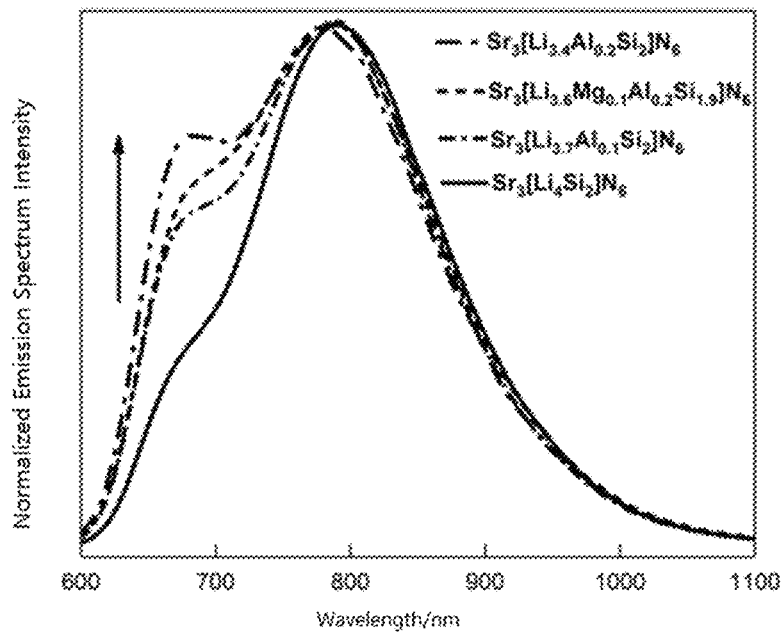
FIG. 9 is an emission spectrum diagram of Embodiments 11 and 23-25 of the present invention, of which chemical compositions are $(Sr_{0.999}Eu_{0.001})_3[Li_4Si_2]N_6$, $(Sr_{0.999}Eu_{0.001})_3[Li_{3.7}Al_{0.1}Si_2]N_6$, $(Sr_{0.999}Eu_{0.001})_3[Li_{3.6}Mg_{0.1}Al_{0.2}Si_{1.9}]N_6$ and $(Sr_{0.999}Eu_{0.001})_3[Li_{3.4}Al_{0.2}Si_2]N_6$, respectively, under excitation of blue light.

FIG. 5 shows the excitation spectrum of Embodiments 1, 11 and 14 of the present invention under the monitoring of the main emission wavelength, and the near-infrared fluorescent material can be effectively excited by ultraviolet light and blue-green light.

Embodiments 15-25

Embodiments 15-25 of the present invention provide eleven nitride near-infrared fluorescent materials activated by Eu₂₊, of which chemical formulas are respectively: $(Sr_{0.999}Eu_{0.001})_3[Li_{3.9}Al_{0.3}Si_{1.8}]N_6$, $(Sr_{0.999}Eu_{0.001})_3[Li_{3.9}Mg_{0.1}Al_{0.1}Si_{1.9}]N_6$, $(Sr_{0.999}Eu_{0.001})_3[Li_{3.8}Mg_{0.1}Si_2]N_6$, $(Sr_{0.999}Eu_{0.001})_3[Li_{3.8}Al_{0.2}Si_{1.9}]N_6$, $(Sr_{0.999}Eu_{0.001})_3[Li_{3.7}Mg_{0.1}Al_{0.3}Si_{1.8}]N_6$, $(Sr_{0.999}Eu_{0.001})_3[Li_{3.7}Mg_{0.2}Al_{0.1}Si_{1.9}]N_6$, $(Sr_{0.999}Eu_{0.001})_3[Li_{3.6}Mg_{0.2}Si_2]N_6$, $(Sr_{0.999}Eu_{0.001})_3[Li_{3.6}Mg_{0.4}Si_{1.8}]N_6$, $(Sr_{0.999}Eu_{0.001})_3[Li_{3.7}Al_{0.1}Si_2]N_6$, $(Sr_{0.999}Eu_{0.001})_3[Li_{3.6}Mg_{0.1}Al_{0.2}Si_{1.9}]N_6$, $(Sr_{0.999}Eu_{0.001})_3[Li_{3.4}Al_{0.2}Si_2]N_6$.

Embodiments 15-25 of the present invention provide a preparation method of the nitride near-infrared fluorescent materials activated by Eu²⁺, including weighing $Sr_3N_2$ powder, $Li_3N$ powder, $Mg_3N_2$ powder, AlN powder, $Si_3N_4$ powder, and EuN powder according to stoichiometric ratio as starting materials, keeping and sintering the materials at 900° C. for 6 hours in a nitrogen-hydrogen mixed atmosphere, furnace cooling, and taking a sample from the furnace for grinding, pulverization and subsequent related tests.

FIGS. 6-9 illustrate emission spectrums of various different materials of Embodiments 11 and 15-25 of the present invention under excitation of blue light. Compared with Embodiment 11, by replacing Li and Si with Mg and Al, the luminous intensity of the emission spectrum in the short-wavelength range can be significantly increased, thereby increasing the half-peak width of the emission spectrum. The half-peak widths of Embodiments 15-25 all are greater than 3500 cm⁻¹. As shown in Table 1, it can be seen that the maximum half-peak width reaches 4101 cm⁻¹.

TABLE 1

Fluorescent materials and their half-peak widths table

| Chemical Composition | Half-Peak Width (Wave Number) |
| --- | --- |
| $(Sr_{0.999}Eu_{0.001})_3[Li_4Si_2]N_6$ | 3108 |
| $(Sr_{0.999}Eu_{0.001})_3[Li_{3.9}Al_{0.3}Si_{1.8}]N_6$ | 4058 |
| $(Sr_{0.999}Eu_{0.001})_3[Li_{3.9}Mg_{0.1}Al_{0.1}Si_{1.9}]N_6$ | 4096 |
| $(Sr_{0.999}Eu_{0.001})_3[Li_{3.8}Mg_{0.1}Si_2]N_6$ | 3521 |
| $(Sr_{0.999}Eu_{0.001})_3[Li_{3.6}Mg_{0.2}Si_2]N_6$ | 3785 |
| $(Sr_{0.999}Eu_{0.001})_3[Li_{3.8}Al_{0.2}Si_{1.9}]N_6$ | 3638 |
| $(Sr_{0.999}Eu_{0.001})_3[Li_{3.6}Al_{0.4}Si_{1.8}]N_6$ | 4064 |
| $(Sr_{0.999}Eu_{0.001})_3[Li_{3.7}Mg_{0.1}Al_{0.3}Si_{1.8}]N_6$ | 4008 |
| $(Sr_{0.999}Eu_{0.001})_3[Li_{3.7}Mg_{0.2}Al_{0.1}Si_{1.9}]N_6$ | 4101 |

Figure 10:
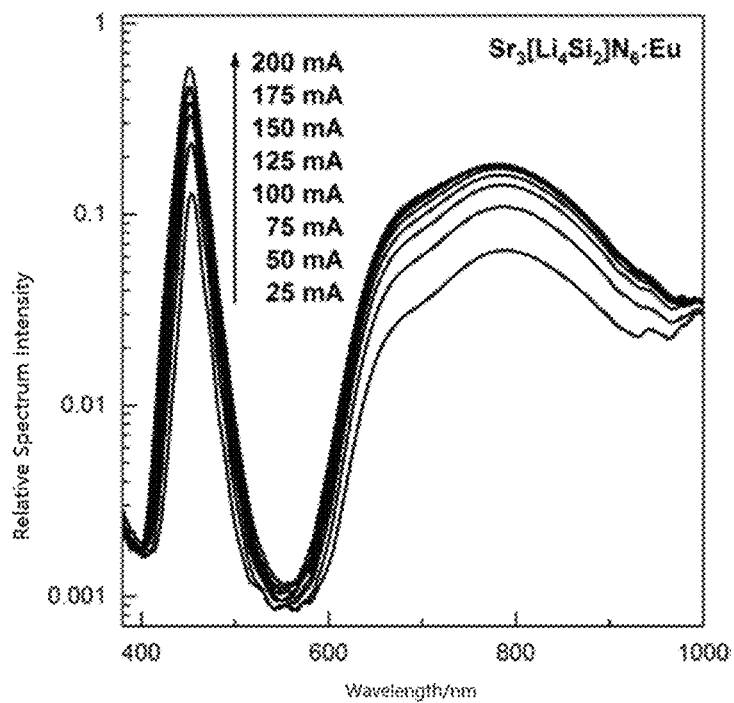
FIG. 10 is a luminescence spectrum diagram of a near-infrared light source under excitation of different currents (25-200 mA), the near-infrared light source being implemented by using Embodiment 11 and a blue light LED package of the present invention.

FIG. 10 illustrates a luminescence spectrum diagram of a near-infrared light source under excitation of different currents (25-200 mA), the near-infrared light source being implemented by Embodiment 11 and a blue light LED package of the present invention, and the near-infrared emission spectrum covering an entire near-infrared optical spectrum range from 600 to 1000 nm.

Figure 11:
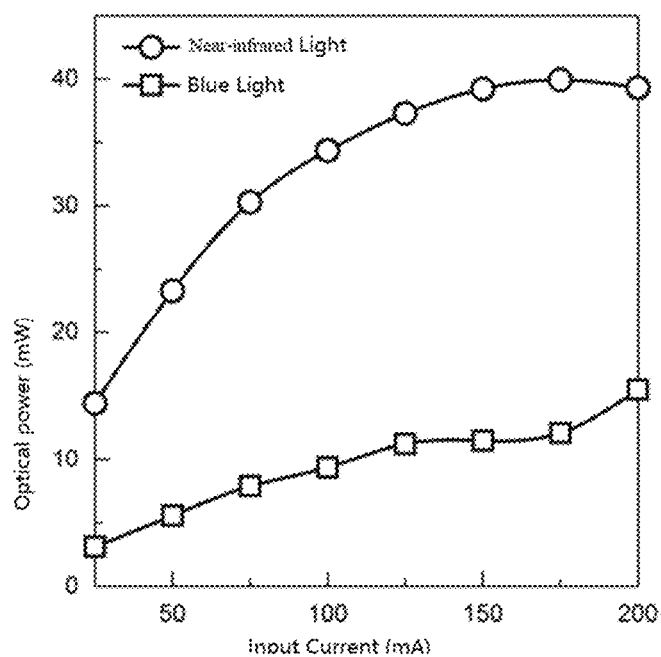
FIG. 11 is an optical power diagram of blue light and near-infrared light output by the Embodiment 11 and blue light LED package of the present invention under excitation of different currents (25-200 mA)

FIG. 11 is an optical power diagram of blue light and near-infrared light of the near-infrared light source under excitation of different currents (25-200 mA), the near-infrared light source being implemented by the Embodiment 11 and blue light LED package of the present invention, and the output near-infrared optical power is up to 41 mW when the input current is 200 mA.

Figure 12:
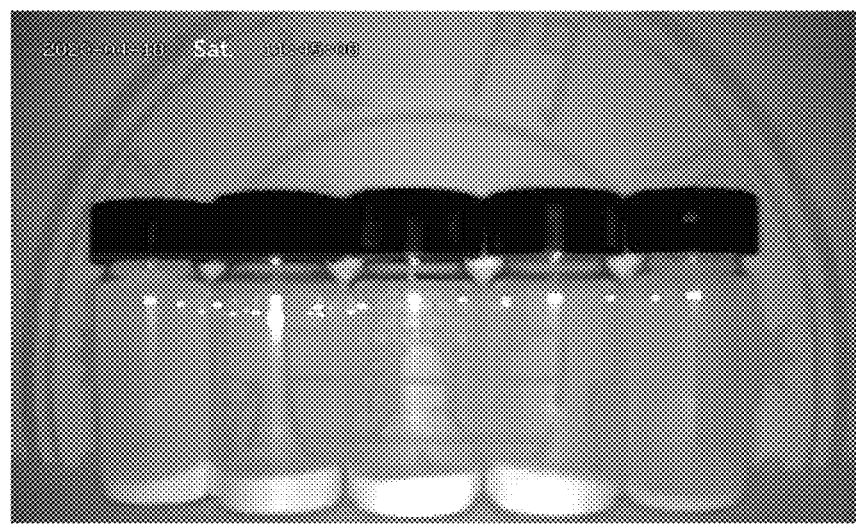
FIG. 12 is a scene diagram of the near-infrared light source of the Embodiment 11 and blue light LED package of the present invention for security imaging.
Figure 13:
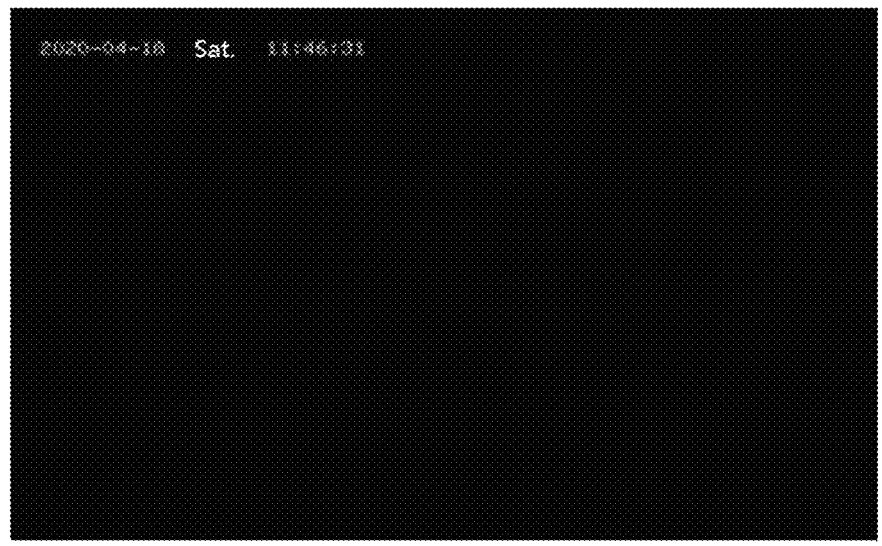
FIG. 13 is a comparison photo of imaging in a dark room without a near-infrared light source.

FIGS. 12-13 illustrate applications of the near-infrared light source implemented by the Embodiment 11 and blue light LED chip package of the present invention in the security field: FIGS. 12 and 13 are respectively photos obtained by using a near-infrared camera in dark rooms with a near-infrared light source and without a light source to illustrate application potential of the near-infrared light source obtained by package in the security field.

INDUSTRIAL APPLICABILITY

The nitride near-infrared fluorescent material of the present invention has simple process, easy-to-obtain raw materials and low cost. The prepared nitride near-infrared fluorescent material has many advantages such as high quantum yield, effective excitation by blue light, large emission spectrum half-peak width and the like, and can be used in security, health monitoring and other fields as a near-infrared light source. It can be expected that the series of near-infrared fluorescent materials and the preparation method thereof of the present invention can be widely used, which greatly promotes the development of the near-infrared light source industry and its application fields.

Comparative Examples 1-3

The present Comparative Examples 1-3 provide three comparative fluorescent materials, of which chemical formulas are respectively: $(Ca_{0.999}Eu_{0.001})_3[Li_4Si_2]N_6$, $(Ca_{0.999}Eu_{0.001})_3[Li_3Al_3]N_6$ and $(Sr_{0.999}Eu_{0.001})_3[Mg_6]N_6$, and a preparation method of three comparative fluorescent materials is: weighing nitride powders of various elements according to stoichiometric ratio as starting materials, keeping and sintering the materials at 900° C. for 6 hours in a nitrogen-hydrogen mixed atmosphere, furnace cooling, and taking a sample from the furnace for grinding, pulverization and subsequent related tests.

Figure 14:
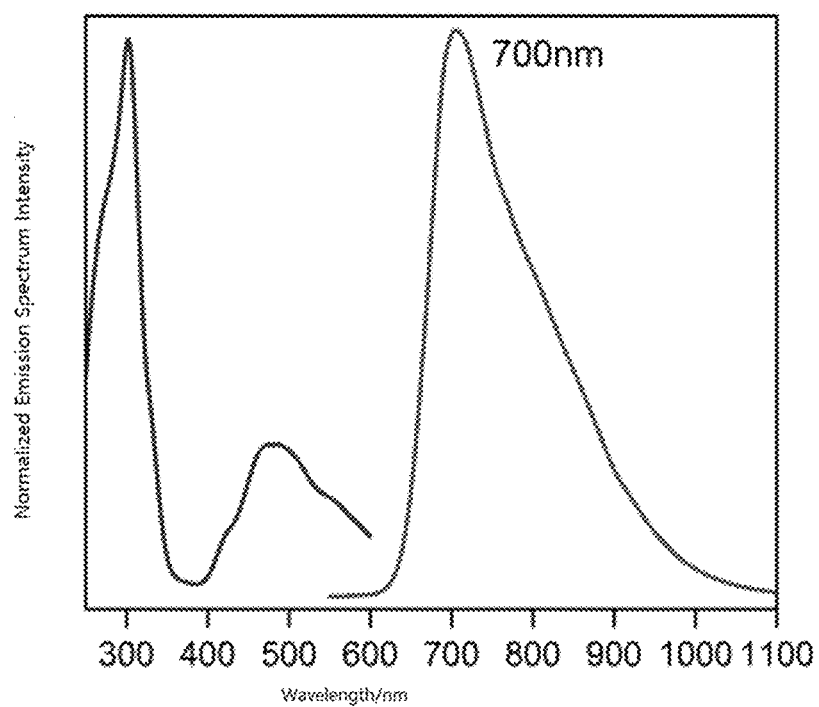
FIG. 14 is an emission spectrum diagram of comparative sample 1.
Figure 15:
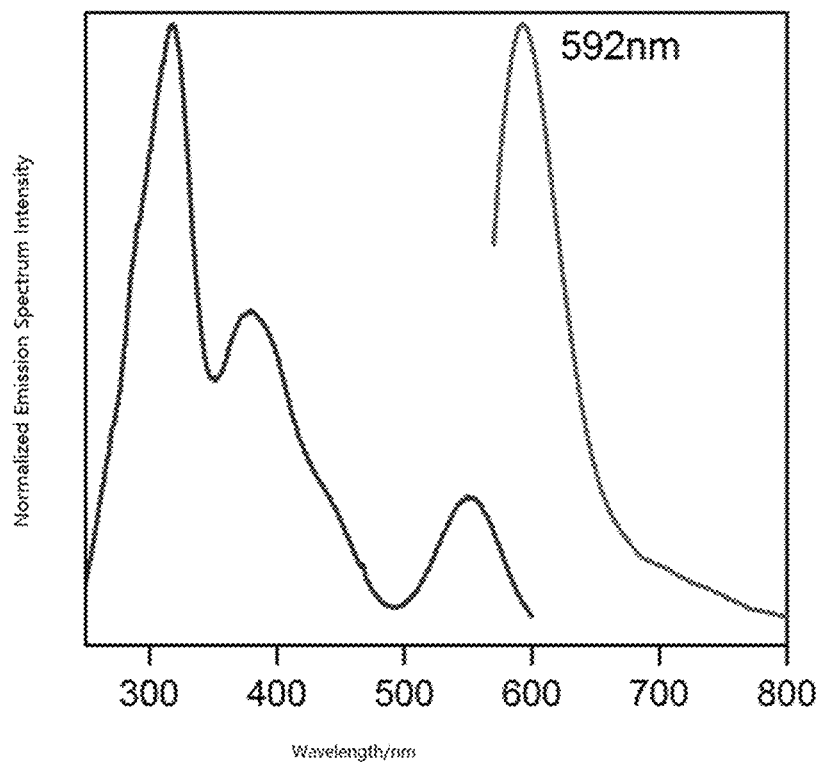
FIG. 15 is an emission spectrum diagram of comparative sample 2.
Figure 16:
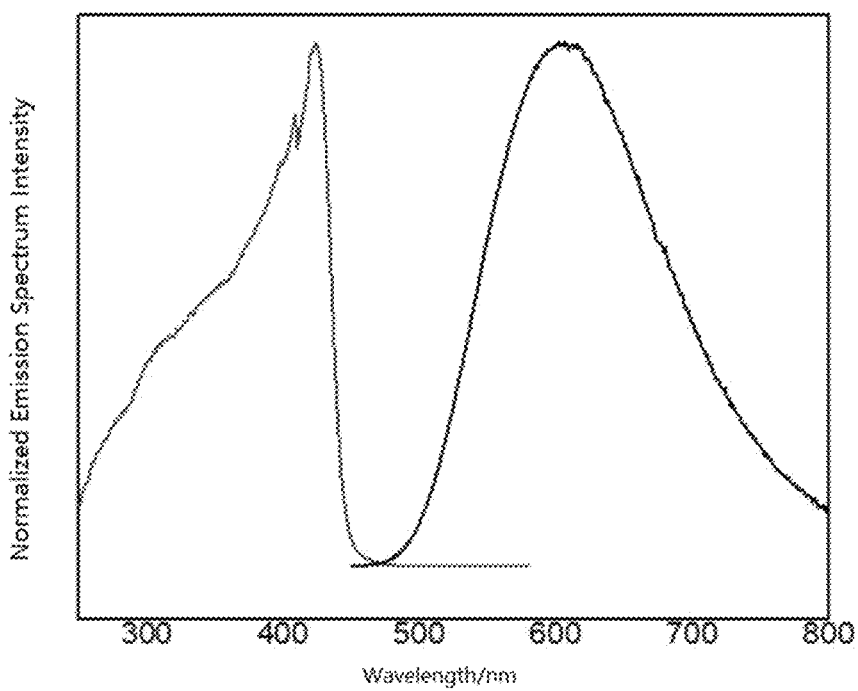
FIG. 16 is an emission spectrum diagram of comparative sample 3.

Referring to FIGS. 14, 15 and 16 for emission spectrums of three comparative fluorescent materials, peak wavelengths of the emission spectrums of $(Ca_{0.999}Eu_{0.001})_3[Li_4Si_2]N_6$, $(Ca_{0.999}Eu_{0.001})_3[Li_3Al_3]N_6$ and $(Sr_{0.999}Eu_{0.001})_3[Mg_6]N_6$ are at 700 nm, 592 nm and 607 nm, respectively. Accordingly, the three comparative fluorescent materials provided by Comparative Examples 1-3 cannot satisfy the requirement that the peak wavelength of the near-infrared fluorescent material is in the range of 700-1100 nm.

The preferred embodiments of the present invention are described in detail above. However, the present invention is not limited to the specific details in the above-mentioned embodiments. Various simple transformations can be made to the technical solution of the present invention within the scope of the technical concept of the present invention. These simple transformations all belong to the protection scope of the present invention.

In addition, it needs to explain that the specific technical features described in the above specific embodiments can be combined in any suitable manner without contradiction. In order to avoid unnecessary repetition, various possible combinations are not explained separately in the present invention.

In addition, various different embodiments of the present invention can also be combined arbitrarily, as long as they do not violate the idea of the present invention, and they should also be regarded as the contents disclosed by the present invention.

What is claimed is:

1. A nitride near-infrared fluorescent material, wherein a general molecular formula of the nitride near-infrared fluorescent material is $(Ca_{1-x-y-z}Sr_xBa_yEu_z)_3[Li_aMg_bAl_cSi_d]N_6$,
    wherein the Eu element enters a crystal site of at least one of Ca, Sr, and Ba, as a luminous element and activator, and
    wherein in the general molecular formula, $0 \leq x < 1$; $0 \leq y \leq 0.3$; $0 < z \leq 0.02$; $3.4 \leq a \leq 4$; $0 \leq b \leq 0.2$; $0 \leq c \leq 0.4$; $1.8 \leq d \leq 2$; $a+2b+3c+4d=12$.

2. The nitride near-infrared fluorescent material of claim 1, wherein in the general molecular formula $(Ca_{1-x-y-z}Sr_xBa_yEu_z)_3[Li_aMg_bAl_cSi_d]N_6$, $0.4 \leq x < 1$; $0 \leq y \leq 0.3$; $0 < z \leq 0.02$.

3. The nitride near-infrared fluorescent material of claim 1, wherein in the general molecular formula $(Ca_{1-x-y-z}Sr_xBa_yEu_z)_3[Li_aMg_bAl_cSi_d]N_6$, $3.4 \leq a \leq 4$; $0 \leq b \leq 0.2$; $0 \leq c \leq 0.4$; $1.8 \leq d \leq 2$.

4. The nitride near-infrared fluorescent material of claim 1, wherein in the general molecular formula, $x=0.699$, $y=0.3$, $z=0.001$, and $a=4$, $b=0$, $c=0$, $d=2$, and in this case, wherein a peak wavelength of an emission spectrum is longest; and is 830 nm.

5. The nitride near-infrared fluorescent material of claim 4, wherein in the general molecular formula, $x=0.5$, $y=0$, $z=0.001$, and $a=4$, $b=0$, $c=0$, $d=2$, and
    wherein a half-peak width of the emission spectrum is maximum; and is 4283 cm$^{-1}$.

6. The nitride near-infrared fluorescent material of claim 4, wherein in the general molecular formula, $x=0.999$, $y=0$, $z=0.001$, and $3.4 \leq a < 4$; $0 \leq b \leq 0.2$; $0 \leq c \leq 0.4$; $1.8 \leq d < 2$, and wherein half-peak widths of the emission spectrum are all greater than 3500 cm$^{-1}$.

7. The nitride near-infrared fluorescent material of claim 4, wherein in the general molecular formula, $x=0.999$, $y=0$, $z=0.001$, and $a=4$, $b=0$, $c=0$, $d=2$, and
    wherein quantum efficiency of the emission spectrum is maximum; and is 77%.

8. The nitride near-infrared fluorescent material of claim 1, wherein the nitride near-infrared fluorescent material emits fluorescence with a peak in a wavelength range of 600 to 1100 nm under excitation of ultraviolet light with a wavelength of 250 to 700 nm.

9. The nitride near-infrared fluorescent material of claim 1, wherein crystals of the nitride near-infrared fluorescent material are generated in a manner of a mixture containing other crystalline or non-crystalline compounds, and
    wherein a mass content of the crystals of the nitride near-infrared fluorescent material in the mixture is not less than 40%.

10. The nitride near-infrared fluorescent material of claim 1, wherein the nitride near-infrared fluorescent material comprises compounds represented by one or more of following chemical formulas: $(Sr_{0.999}Eu_{0.001})_3[Li_4Si_2]N_6$, $(Ca_{0.5}Sr_{0.499}Eu_{0.001})_3[Li_4Si_2]N_6$, $(Sr_{0.699}Ba_{0.3}Eu_{0.001})_3[Li_4Si_2]N_6$, $(Sr_{0.999}Eu_{0.001})_3[Li_{3.9}Al_{0.3}Si_{1.8}]N_6$, $(Sr_{0.999}Eu_{0.001})_3[Li_{3.9}Mg_{0.1}Al_{0.1}Si_{1.9}]N_6$, $(Sr_{0.999}Eu_{0.001})_3[Li_{3.6}Al_{0.4}Si_{1.8}]N_6$, $(Sr_{0.999}Eu_{0.001})_3[Li_{3.7}Mg_{0.1}Al_{0.3}Si_{1.8}]N_6$, $(Sr_{0.999}Eu_{0.001})_3[Li_{3.7}Mg_{0.2}Al_{0.1}Si_{1.9}]N_6$.

11. A preparation method of the nitride near-infrared fluorescent material of claim 1, said method comprising:
    weighing $Ca_3N_2$ powder, $Sr_3N_2$ powder, $Ba_3N_2$ powder, $Li_3N$ powder, $Mg_3N_2$ powder, AlN powder, $Si_3N_4$ powder, and EuN and/or $Eu_2O_3$ and/or $EuF_3$ and/or $EuCl_2$ powder, respectively according to a stoichiometric ratio of the general molecular formula as starting materials;
    fully mixing the materials uniformly in a glove box filled with nitrogen atmosphere to prepare a raw material mixture; and
    keeping and sintering the obtained raw material mixture at a temperature range of 800-1000° C. for 2-6 hours in a nitrogen-hydrogen mixed atmosphere or a nitrogen-hydrogen-ammonia mixed atmosphere to obtain the nitride near-infrared fluorescent material.

12. The preparation method of the nitride near-infrared fluorescent material of claim 11, wherein during said weighing a particle size of the powder is at micron, sub-micron or nanometer level.

13. The preparation method of the nitride near-infrared fluorescent material of claim 11, wherein during said keeping and sintering the obtained raw material mixture the mixed atmosphere is normal pressure or micro-positive pressure, and a pressure value of the micro-positive pressure is 0-1 MPa.

14. The preparation method of the nitride near-infrared fluorescent material of claim 11, wherein during said keeping and sintering the obtained raw material mixture the raw material mixture is kept and sintered at a temperature range of 850-950° C. for 2-6 hours.

15. The preparation method of the nitride near-infrared fluorescent material of claim 1, wherein said keeping and sintering the obtained raw material mixture comprises:
   keeping sintering the obtained raw material mixture at a temperature range of 800-1000° ° C. for 2-6 hours in a nitrogen-hydrogen mixed atmosphere or a nitrogen-hydrogen-ammonia mixed atmosphere; and
   subjecting the sintered product to heat treatment at a temperature greater than 500° C. and less than 800-1000° C. for 1-10 hours in a hydrogen atmosphere to obtain the nitride near-infrared fluorescent material.

16. A light-emitting device comprising a fluorescent material and an excitation light source, wherein the fluorescent material is the nitride near-infrared fluorescent material of claim 1, and wherein a wavelength of the excitation light source is 250-700 nm.

* * * * *